(12) United States Patent
Prasad et al.

(10) Patent No.: US 7,076,712 B2
(45) Date of Patent: Jul. 11, 2006

(54) GENERATING A TEST SEQUENCE USING A SATISFIABILITY TECHNIQUE

(75) Inventors: Mukul R. Prasad, Sunnyvale, CA (US); Michael S. Hsiao, Blacksburg, VA (US); Jawahar Jain, Santa Clara, CA (US)

(73) Assignee: Fujitsu Limited, Kawasaki (JP)

( * ) Notice: Subject to any disclaimer, the term of this patent is extended or adjusted under 35 U.S.C. 154(b) by 425 days.

(21) Appl. No.: 10/444,483

(22) Filed: May 22, 2003

(65) Prior Publication Data

US 2004/0237012 A1    Nov. 25, 2004

(51) Int. Cl.
  *G06F 11/00*  (2006.01)
(52) U.S. Cl. ........................ 714/739; 714/741
(58) Field of Classification Search ............... 716/18, 716/5; 703/15, 14; 714/724, 741, 739
  See application file for complete search history.

(56) References Cited

U.S. PATENT DOCUMENTS

| | | | | |
|---|---|---|---|---|
| 5,345,393 | A * | 9/1994 | Ueda ........................... | 716/18 |
| 5,410,678 | A * | 4/1995 | Takasaki ..................... | 703/15 |
| 5,884,065 | A * | 3/1999 | Takasaki ..................... | 703/14 |
| 6,018,813 | A * | 1/2000 | Chakradhar et al. ........ | 714/724 |
| 6,026,222 | A * | 2/2000 | Gupta et al. ................. | 716/5 |

OTHER PUBLICATIONS

Abdulla, et al., "*Symbolic Reachability Analysis Based on SAT-Solvers*," Uppsala University and Prover Technology, Sweden, Chalmers University of Technology, Sweden (15 pages), unknown.

Agrawal, et al., "*Combinational ATPG Theorems for Identifying Untestable Faults in Sequential Circuits,*" © 1995 IEEE Transactions on Computer-Aided Design of Integrated Circuits and Systems, vol. 14, No. 9, Sep. 1995 (pp. 1155-1160).

Clarke, et al., "*Bounded Model Checking Using Satisfiability Solving*," Computer Science Dept., CMU, PA: Inst. of Computer Systems, Zürich, BOPS, Inc., TX; Synopsys, Inc., CA, Published in Formal Methods in System Design, vol. 19, Issue 1.(20 pages), Jul. 2001.

(Continued)

*Primary Examiner*—David Ton
(74) *Attorney, Agent, or Firm*—Baker Botts L.L.P.

(57) ABSTRACT

Generating a test sequence includes receiving a circuit representation describing a circuit, and a fault associated with the circuit representation. A miter circuit model associated with a good circuit model and a faulty circuit model is established according to the circuit representation. A satisfiability problem corresponding to the fault as associated with the miter circuit model is also established. Whether the satisfiability problem is satisfiable is determined. If the satisfiability problem is satisfiable, a test sequence is generated for the fault as associated with the miter circuit model.

43 Claims, 4 Drawing Sheets

OTHER PUBLICATIONS

Boppana, et al., "*Model Checking Based on Sequential ATPG*," Fujitsu Labs. of America, Inc., CA (13 pages), unknown.

Goldberg, et al., "*BerkMin: a Fast and Robust Sat-Solver*," Cadence Berkeley Labs, USA; Academy of Sciences (Belarus) (8 pages), unknown.

Hsiao, et al., "*Alternating Strategies for Sequential Circuit ATPG*," Univ. of Illinois, *European Design & Test Conference*, Mar. 1996 (pp. 368-374).

Hsiao, et al., "*Sequential Circuit Test Generation Using Dynamic State Traversal*," Univ. of Illinois, *European Design & Test Conference*, Mar. 1997 (pp. 22-28).

Larrabee, "*Test Pattern Generation Using Boolean Satisfiability*," © 1992 IEEE Transactions on Computer-Aided Design of Integrated Circuits and Systems, vol. 11, No. 1, Jan. 1992 (pp. 4-15).

Marques-Silva, et al., "*GRASP: A Search Alogorithm for Propositional Satisfiability*," © 1999 IEEE Transactions on Computers, vol. 48, No. 5, May 1999 (pp. 506-521).

Moskewicz, et al., "*Chaff: Engineering an Efficient SAT Solver,*" Department of EECS, UC Berkeley, Department of EECS, MIT, Department of Elec. Eng., Princeton University (6 pages), unknown.

Mukherjee, et al., "*An Efficient Filter-Based Approach for Combinational Verification*," © 1999 *IEEE*, vol. 18, No. 11, Nov. 1999 (pp. 1542-1557).

Niermann, et al., "*HITEC: A Test Generation Package for Sequential Circuits*," © 1991 *IEEE*, European Design Automation Conference (EDAC-91) Amsterdam, The Netherlands (pp. 214-218), Feb.-Mar. 1991.

Goldberg, et al., "*Using SAT for Combinational Equivalence Checking*," Cadence, Synopsys and Fujitsu (8 pages), unknown.

Reddy, et al., "*New Procedures for Identifying Undetectable and Redundant Faults in Synchronous Sequential Circuits,*" (NSF Grant No. MIP-9387581 and NSF Grant No. MIP-9725053) (7 pages), unknown.

Rudnick, et al., "*Combining Deterministic and Genetic Approaches for Sequential Circuit Test Generation*," © 1995 ACM 0-89791-756-1/95/0006 (6 pages), 1995.

Sheeran, et al., "*Checking Safety properties Using Induction and a SAT-Solver*," Prover Tech. AB, Sweden; Chalmers Univ. of Tech., Sweden; Xilinx Inc., CA (18 pages), unknown.

Sheng, et al., "*Effective Safety Property Checking Using Simulation-Based Sequential ATPG*," DAC 2002, New Orleans, Louisiana, ACM 1-58113-461-4/02/006 (6 pages), 2002.

Shtrichman, "*Tuning SAT Checkers for Bounded Model Checking*," CAV 2000 The Weizmann Institute of Science, Israel; and IBM Haifa Research Lab. (15 pages), 2000.

Shtrichman, "*Pruning Techniques for the SAT-Based Bounded Model Checking Problem*," CHARME '01 The Weizmann Institute of Science, Israel; and IBM Haifa Research Lab. (13 pages), 2001.

Stephan, et al., "*Combinational Test Generation Using Satisfiability*," © 1996 IEEE Transactions on Computer-Aided Design of Integrated Circuits and Systems, vol. 15, No. 9, Sep. 1996 (pp. 1167-1176).

Zhang, "*SATO: An Efficient Propositional Prover*," NSF Grants CCR-9504205 and CCR-9357851 (4 pages), unknown.

Prasad, et al., "*An Efficient and Scalable Methodology for Latch Correspondence Using Hybrid Methods & Incremental Reasoning Implemented on a General Purpose Combinational Equivalence Checker*," Mar. 31, 2002, Fujitsu Labs of America and Univ. of British Columbia (9 pages).

Guo, et al., "*PROPTEST: A Property Based Test Pattern Generator for Sequential Circutis Using Test Compaction**," DAC '99, New Orleans, Louisiana, (c) 1999 ACM 1-58113-109-7/99/06, (7 pages).

Konuk, et al., "*Explorations of Sequential ATPG Using Boolean Satisfiability*," Board of Studies in Computer Engineering, University of California, Santa Cruz, Santa Cruz, California (6 pages), unknown.

Lin, et al., "*Techniques for Improving the Efficiency of Sequential Circuit Test Generation*," 0-7803-5832-X/99 © IEEE, 5 pages.

Wang, et a., "*Conflict Driven Techniques for Improving Deterministic Test Pattern Generation*," 0-7803-7607-2/02 © 2002 IEEE (7 pages).

Pomeranz, et al., "*Vector Restoration Based Static Compaction of Test Sequences for Synchronous Sequential Circuits*," Proceedings of the 1997 International Conference on Computer Design (ICCD '97), 0-8186-8206-X/97, © 1997, IEEE, (pp. 360-365).

Guo, et al., "*Procedures for Static Compaction of Test Sequences for Synchronous Sequential Circuits Based on Vector Restoration*," Electrical and Computer Engineering Department, Unversity of Iowa, Iowa City, Iowa, (5 pages), unknown.

Hsiao, et al., "*Fast Static Compaction Algorithms for Sequential Circuit Test Vectors*," IEEE Transactions on Computers, vol. 48, No. 3, 0018-9340/99 © 1999 IEEE, (pp. 311-322), Mar. 1999.

Hsiao, et al., "*State Relaxation Based Subsequence Removal for Fast Static Compaction in Sequential Circuits*," Department of Electrical and Computer Engineering, Rutgers University, Piscataway, New Jersey, Computer & Communications Research Lab. NEC USA, Princeton, NJ (6 pages). unknown.

Pomeranz, et al., "*On Static Compaction of Test Sequences for Synchronous Sequential Circuits*," 33rd Design Automation Conference, DAC 96-06/96, Las Vegas, NV, USA, © 1996 ACM, Inc. 0-89791-833-9/96/0006 (6 pages).

Niermann, et al., "*Test Compaction for Sequential Circuits*," Short Papers, IEEE Transactions On Computer-Aided Design, vol. 11, No. 2, 0278-0070/92 © 1992 IEEE, (pp. 260-267), Feb. 1992.

Prasad, et al., "*Improving Sequential ATPG Using SAT Methods*," Fujitsu Laboratories of America, Sunnyvale, CA, Bradley Department of Electrical and Computer Engineering, Virginia Tech, Blacksburg, VA, (6 pages), presented Jun. 2, 2002.

* cited by examiner

GENERATING A TEST SEQUENCE USING A SATISFIABILITY TECHNIQUE

TECHNICAL FIELD OF THE INVENTION

This invention relates generally to the field of integrated circuits and more specifically to generating a test sequence using a satisfiability technique.

BACKGROUND OF THE INVENTION

Testing a circuit involves determining a test sequence for a fault of the circuit. If the test sequence is input into the circuit, different outputs are obtained depending upon the presence of the fault. Generating a test sequence, however, is typically a time consuming process. Consequently, known techniques for generating test sequences are unsatisfactory in certain situations.

SUMMARY OF THE INVENTION

In accordance with the present invention, disadvantages and problems associated with previous techniques for generating a test sequence may be reduced or eliminated.

According to one embodiment of the present invention, generating a test sequence includes receiving a circuit representation describing a circuit, and a fault associated with the circuit representation. A miter circuit model associated with a good circuit model and a faulty circuit model is established according to the circuit representation. A satisfiability problem corresponding to the fault as associated with the miter circuit model is also established. Whether the satisfiability problem is satisfiable is determined. If the satisfiability problem is satisfiable, a test sequence is generated for the fault as associated with the miter circuit model.

Certain embodiments of the invention may provide one or more technical advantages. A technical advantage of one embodiment may be that a satisfiability solver may be used to classify a fault as testable or untestable, which may provide for more efficient test sequence generation. Another technical advantage of one embodiment may be that a satisfiability solver may be used to generate shorter test sequences, which may provide for more efficient testing of circuits.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 10 of the drawings, like numerals being used for like and corresponding parts of the various drawings.

1. Test Pattern Generation System

Figure 1:
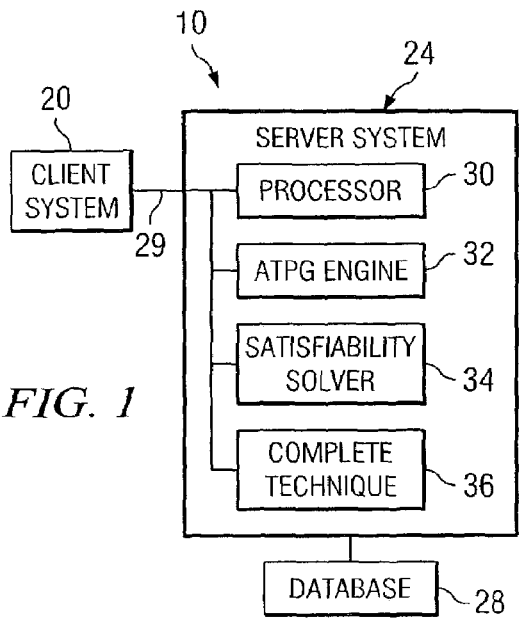
FIG. 1 is a block diagram of one embodiment of a system for generating a test sequence using a satisfiability technique.

FIG. 1 is a block diagram of one embodiment of a system 10 for generating a test sequence using a satisfiability technique. System 10 attempts to integrate a satisfaction technique with an automatic test pattern generation engine. The integration may provide for identifying untestable faults and for determining relatively short test sequences.

According to one embodiment, system 10 generates test sequences for circuits such as synchronous sequential circuits S using combinational circuit models $C_k$. A combinational circuit model $C_k$ comprises a k-length iterative logic array (ILA) model of a sequential circuit S that corresponds to k copies of the combinational logic CL of sequential circuit S strung together. Combinational circuit model $C_k$ may be generated by unrolling sequential circuit S for k time frames.

According to the illustrated embodiment, system 10 includes a client system 20, a server system 24, and a database 28 coupled as shown in FIG. 1. According to one embodiment, client system 20 allows a user to communicate with server system 24 to generate test sequences. Database 28 stores data used by server system 24.

Server system 24 includes an input-output 29 that receives and sends information, and a processor 30 that controls certain operations of system 10. Processor 30 may comprise any suitable device operable to accept input, process the input according to predetermined rules, and produce output. Server system 24 manages applications that generate test sequences, such as an automatic test pattern generation (ATPG) engine 32, a satisfiability solver 34, and a complete technique module 36.

Automatic test pattern generation engine 32 operates to generate test sequences according to an incomplete test pattern generation technique. Automatic test pattern generation engine 32 may comprise an incomplete simulation-based sequential automatic test pattern generation tool that uses any suitable process such as genetic algorithms (GAs). An example of an automatic test pattern generation engine 32 may comprise, for example, STRATEGATE developed by Michael S. Hsiao, which is a simulation-based tool that uses genetic algorithms.

Satisfiability solver 34 operates to solve a satisfiability problem, and may be used to identify untestable faults and to generate relatively short test sequences. Satisfiability solver 34 may perform Boolean reasoning on a combinational circuit model $C_k$ to solve a satisfiability problem. After attempting to solve a satisfiability problem, satisfiability solver 34 may either return a test vector corresponding to the solution of the satisfiability problem or report that the satisfiability problem is not solvable.

According to one embodiment, satisfiability solver 34 may identify one or more faults of a given fault list as untestable. According to another embodiment, satisfiability solver 34 may take a particular fault and a pair of current states for good and faulty versions of a circuit, respectively, and find a test sequence for the given fault using the current states as a starting point. According to yet another embodiment, satisfiability solver 34 may receive a fault and a corresponding pair of current states as well as a pair of target states, which may be the same for good and faulty circuits. The target states may be selected such that a test sequence for the given fault is known from the target states onwards. Satisfiability solver 34 may find a sequence of input vectors that take the good and faulty circuits from the pair of current states to the pair of target states.

Complete technique module 36 may generate test sequences according to any suitable complete test sequence generation technique such as a branch-and-bound technique, and may comprise, for example, the Path Oriented DEcision Making (PODEM) procedure developed by Prabhu Goel or the HITEC procedure developed by Thomas Niermann. Complete technique module 36 may be used to handle faults that cannot be resolved by satisfiability solver 34.

In operation, automatic test pattern generation engine 32 may operate to generate a test sequence for a fault according to an incomplete test pattern generation technique. Faults that are not resolved by automatic test pattern generation engine 32 may be incorporated into a satisfiability problem. Satisfiability solver 34 may attempt to solve the satisfiability problem in order to identify untestable faults or to generate relatively short test sequences. Satisfiability solver 34 may be integrated with incomplete and complete techniques to generate test patterns. Complete technique module 36 may be used to handle faults that cannot be resolved by satisfiability solver 34.

Client system 20 and server system 24 may each operate on one or more computers and may include appropriate input devices, output devices, mass storage media, processors, memory, or other components for receiving, processing, storing, and communicating information according to the operation of system 10. As used in this document, the term "computer" refers to any suitable device operable to accept input, process the input according to predefined rules, and produce output, for example, a personal computer, work station, network computer, wireless telephone, personal digital assistant, one or more microprocessors within these or other devices, or any other suitable processing device.

Client system 20 and server system 24 may be integrated or separated according to particular needs. For example, the present invention contemplates the functions of both client system 20 and server system 24 being provided using a single computer system, for example, a single personal computer. If client system 20 and server system 24 are separate, client system 20 may be coupled to server system 24 using one or more local area networks (LANs), metropolitan area networks (MANs) wide area networks (WANs), a global computer network such as the Internet, or any other appropriate wireline, wireless, or other links.

Database 28 stores data that may be used by server system 24. Database 28 may be local to or remote from server system 24, and may be coupled to server system 24 using one or more local area networks (LANs), metropolitan area networks (MANs), wide area networks (WANS), a global computer network such as the Internet, or any other appropriate wireline, wireless, or other links.

Modifications, additions, or omissions may be made to system 10 without departing from the scope of the invention. Moreover, the operations of system 10 may be performed by more or fewer modules. For example, the operations of automatic test pattern generation engine 32 and satisfiability solver 34 may be performed by one module, or the operations of satisfiability solver 34 may be performed by more than one module. Additionally, functions may be performed using any suitable logic comprising software, hardware, other logic, or any suitable combination of the preceding. As used in this document, "each" refers to each member of a set or each member of a subset of a set.

2. Test Pattern Generation Flow

Figure 2:
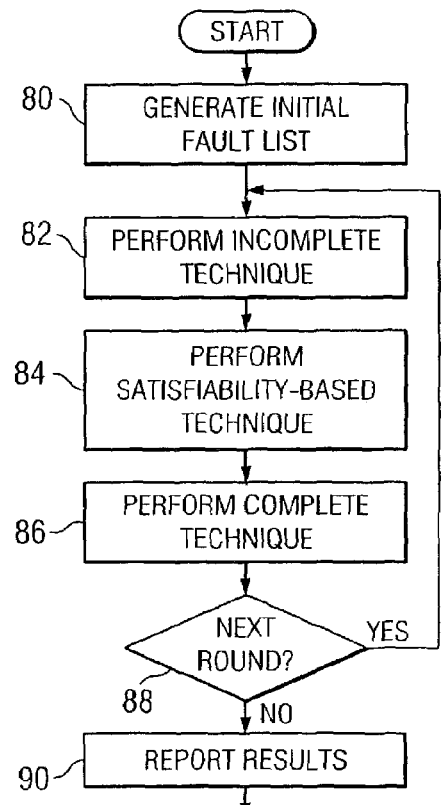
FIG. 2 is a flowchart illustrating one embodiment of a method for generating a test sequence as may be performed by the system of FIG. 1.

FIG. 2 is a flowchart illustrating one embodiment of a method for generating a test sequence that may be performed by system 10. System 10 may target one fault of a fault list at a time, sequentially processing the fault list, and potentially making several iterations, or rounds, through the list. At each point during execution, system 10 may maintain a single test vector sequence that can be used to test the faults that have been tested thus far.

According to the illustrated embodiment, the method begins at step 80, where an initial fault list is generated. The fault list may be pruned using any suitable pre-processing technique such as random weighted simulation. An incomplete technique such as a simulation-based automatic test pattern generation technique may be performed to generate test sequences at step 82. Any suitable tool may be used to perform the incomplete technique such as the STRATE-GATE tool.

If faults are unresolved by the incomplete technique, satisfiability solver 34 may perform a satisfiability-based technique step 84 to provide additional processing to resolve the faults. According to one embodiment, satisfiability solver 34 may be used to identify untestable faults. According to another embodiment, satisfiability solver 34 may be used to generate relatively short test sequences. Any suitable solver may be used to perform the satisfiability-based technique such as a conjunctive normal form (CNF) formula-based satisfiability solver implementing a branch-and-bound search procedure with backtracking and learning techniques.

A complete technique may be performed at step 86 to resolve faults that cannot be handled by either the incomplete technique or satisfiability solver 34. As an example, the complete technique may identify faults as untestable or may generate test sequences. Any suitable procedure may be used to perform the complete technique such as a circuit-based complete branch and bound search procedure, for example, the Path Oriented DEcision Making (PODEM) procedure or the HITEC procedure. Other suitable procedures may include, for example, a search based on decision diagrams (BDDs).

Whether there is a next round is determined at step 88. The decision may be made based on the number of unresolved faults, resource usage, or both. As an example, if there are still unresolved faults and a runtime/memory resource limit has not been exceeded, a next round may be executed. Any suitable number of rounds may be used to generate a test sequence. If there is a next round, the method returns to step 82 to perform the incomplete technique for the next round. Certain modifications may be made at subsequent rounds. As an example, circuit models $C_k$ that include more time frames k may be processed at subsequent rounds. If there is no next round, the method proceeds to step 90 to report the results. After reporting the results, the method terminates.

In summary, the method illustrates that a satisfiability technique may be used to perform additional processing, which may allow system 10 to more efficiently generate test sequences. As an example, satisfiability solver may be used to classify certain faults as untestable or may be used to generate more efficient test sequences.

3. Classifying Faults Using A Satisfiability Solver

Figure 3:
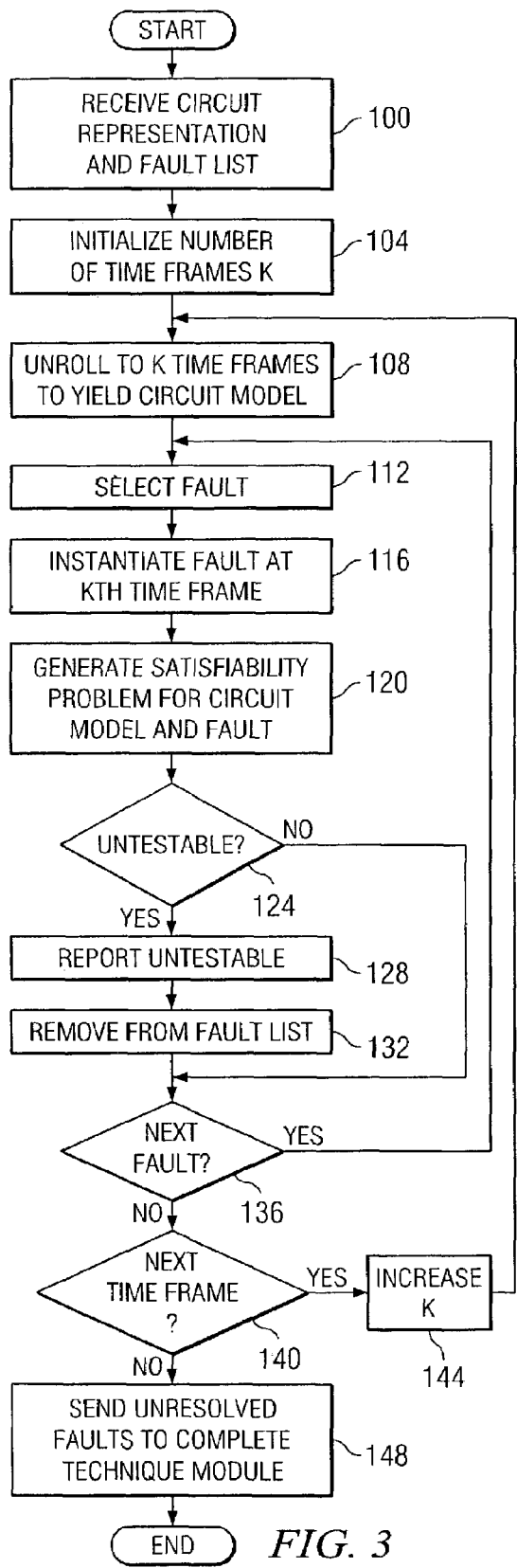
FIG. 3 is a flowchart illustrating one embodiment of a method for classifying a fault as untestable.

FIG. 3 is a flowchart illustrating one embodiment of a method for classifying a fault as untestable. The method begins at step 100, where a representation of sequential circuit S and a fault list is received. The representation may comprise any suitable representation of a circuit. An example sequential circuit S is described in more detail with respect to FIG. 4.

Figure 4:
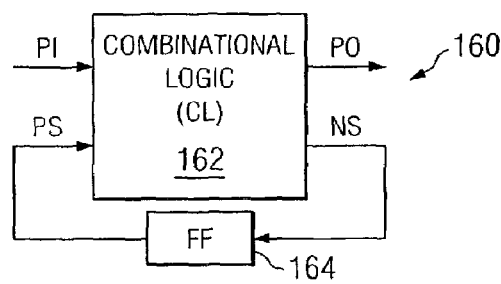
FIG. 4 is a diagram of an example sequential circuit.
Figure 5:
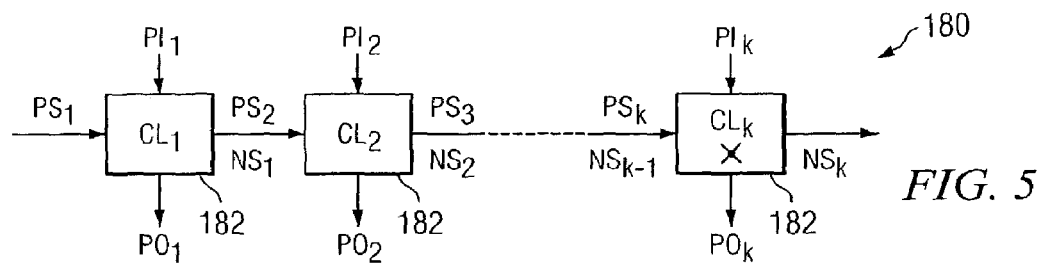
FIG. 5 is a diagram of an example k-length iterative logic array (ILA) model.

FIG. 4 is a diagram of an example sequential circuit 160. Sequential circuit 160 includes combinational logic CL 162 and flip-flop FF 164 coupled as shown in FIG. 5. Combinational logic 162 receives primary input PI and generates primary output PO. Next state NS output is transmitted through flip-flop 164 to become present state PS input.

Referring back to FIG. 3, an index k representing a number of time frames is initialized at step 104. Sequential circuit S is unrolled k times at step 108 to yield a k-length iterative logic array (ILA) model $C_k$ for sequential circuit S. An example k-length ILA model $C_k$ is described in more detail with respect to FIG. 5.

FIG. 5 is a diagram of an example k-length iterative logic array (ILA) model $C_k$ 180. Model $C_k$ 180 includes a number k of combinational logic $CL_i$ 182 coupled as shown in FIG. 5. Each combinational logic $CL_i$ 182 receives primary input $PI_i$ and generates primary output $PO_i$. Next state $NS_i$ output from combinational logic $CL_i$ 182 becomes present state $PS_{i+1}$ input for combinational logic $CL_{i+1}$ 182. An "X" indicates the instantiation of a fault.

Referring back to FIG. 3, model $C_k$ may be used to classify a fault of sequential circuit S as untestable. For a k-length iterative logic array model $C_k$ of sequential circuit S with a target fault f instantiated in the $k^{th}$ time frame, that is, at combinational logic $CL_k$, the following may hold:

Single-Fault Theorem. A target fault f that is untestable in model $C_k$ is also untestable in sequential circuit S.

A fault f is selected from the fault list at step 112. The selected fault f is instantiated at the kth time frame at step 116. A satisfiability problem is generated for model $C_k$ and fault f at step 120. According to one embodiment, a conjunctive normal form (CNF) formula $\phi$ may be generated from model $C_k$ and fault f using satisfiability-based formulations of combinational automatic test sequence generation. According to the embodiment, formula $\phi$ is unsatisfiable if and only if fault f is untestable in model $C_k$.

The untestability of fault f in model $C_k$ is determined at step 124. According to one embodiment, formula $\phi$ may be solved by satisfiability solver 34 to determine if fault f is untestable in model $C_k$. If formula $\phi$ is unsatisfiable, then fault f is untestable in model $C_k$, and if formula $\phi$ is satisfiable, then fault f is testable in model $C_k$. Otherwise, the fault f is unresolved.

If fault f is untestable in model $C_k$ at step 124, the method proceeds to step 128, where fault f is reported as untestable. Fault f is removed from the fault list and excluded from further consideration at step 132. The method proceeds to step 136. If fault f is not untestable in model $C_k$ at step 144, the method proceeds directly to step 136.

If there is a next fault f at step 136, the method returns to step 112 to select the next fault f. If there is no next fault f at step 136, the method proceeds to step 140 to determine whether there is a next time frame. The method may be repeated for a model $C_k$ having a different number k of time frame such as a larger number k of time frames. If there is a next time frame at step 140, the method proceeds to step 144 to increase index k to represent the next time frame. After increasing index k, the method returns to step 108 to unroll sequential circuit S. If there is no next time frame at step 140, the method proceeds to step 148. The unresolved faults are sent to a complete technique module for processing at step 148. After sending the unresolved faults, the method terminates.

According to one embodiment, the method utilizes techniques for translating a satisfiability problem posed on a circuit to a formula capable of being solved using a satisfiability technique. The satisfiability technique may then be used to identify a given fault as untestable by solving a combinational ATPG problem on a suitable combinational circuit derived by unrolling the original sequential circuit for several time frames. The satisfiability technique may be used at certain points of the method. Using the technique too early may make the method too slow since too many faults would be targeted. Using the technique too late, however, may not allow for identification of many untestable faults.

Modifications, additions, or omissions may be made to the method without departing from the scope of the invention. For example, an explicit iterative logic array model need not be generated. An appropriate formula may be generated directly through a transversal of sequential circuit S. Additionally, steps may be performed in any suitable order without departing from the scope of the invention.

3. Determining A Test Sequence Using A Satisfiability Solver

Figure 6:
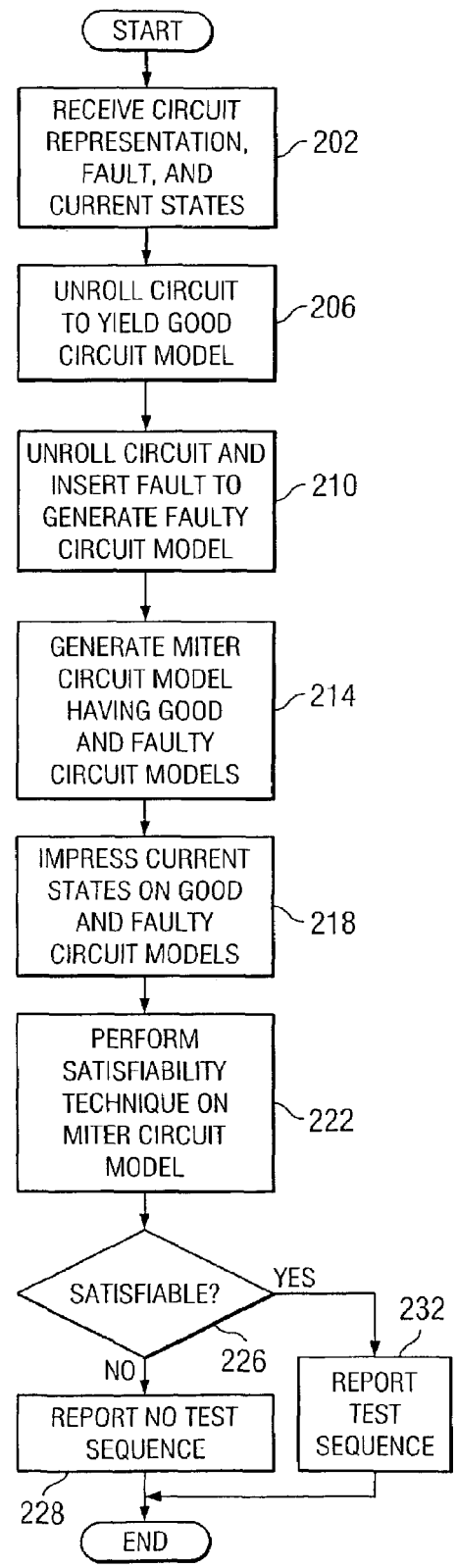
FIG. 6 is a flowchart illustrating one embodiment of a method for determining a sequence for testing a fault.

FIG. 6 is a flowchart illustrating one embodiment of a method for determining a sequence for testing a fault. According to the embodiment, given a sequential circuit, a single stuck-at fault, and the current states of good and faulty circuits of the sequential circuit, the method may find a test sequence. If the good and faulty circuits are initialized at the current states and the test sequence is supplied to the good and faulty circuits, the good and faulty circuits produce different output sequences. According to the embodiment, a test sequence of length $\leq k$, for some given k-length ILA model $C_k$ may be determined if one exists.

The method begins at step 202, where a representation of sequential circuit S, a single stuck-at fault f, a current state CS of a good circuit, and a current state $CS^f$ of a faulty circuit are received. According to one embodiment, the current state refers to the final state of a good circuit under a 3-valued simulation with the current test sequence, starting with a state of X values on the state lines.

Steps 206 through 214 describe generating a miter circuit model $C_k^{ATPG}(f)$ from sequential circuit S according to one embodiment. Sequential circuit S is unrolled k times to yield a k-length ILA model $C_k$ of the good circuit at step 206. Sequential circuit S is unrolled k times and f fault is instantiated at each time frame to yield a k-length ILA model $C_k^f$ of the faulty circuit at step 210. Miter circuit model $C_k^{ATPG}(f)$ is generated from model $C_k$ and model $C_k^f$ at step 214. An example miter circuit is described in more detail with reference to FIG. 7.

Figure 7:
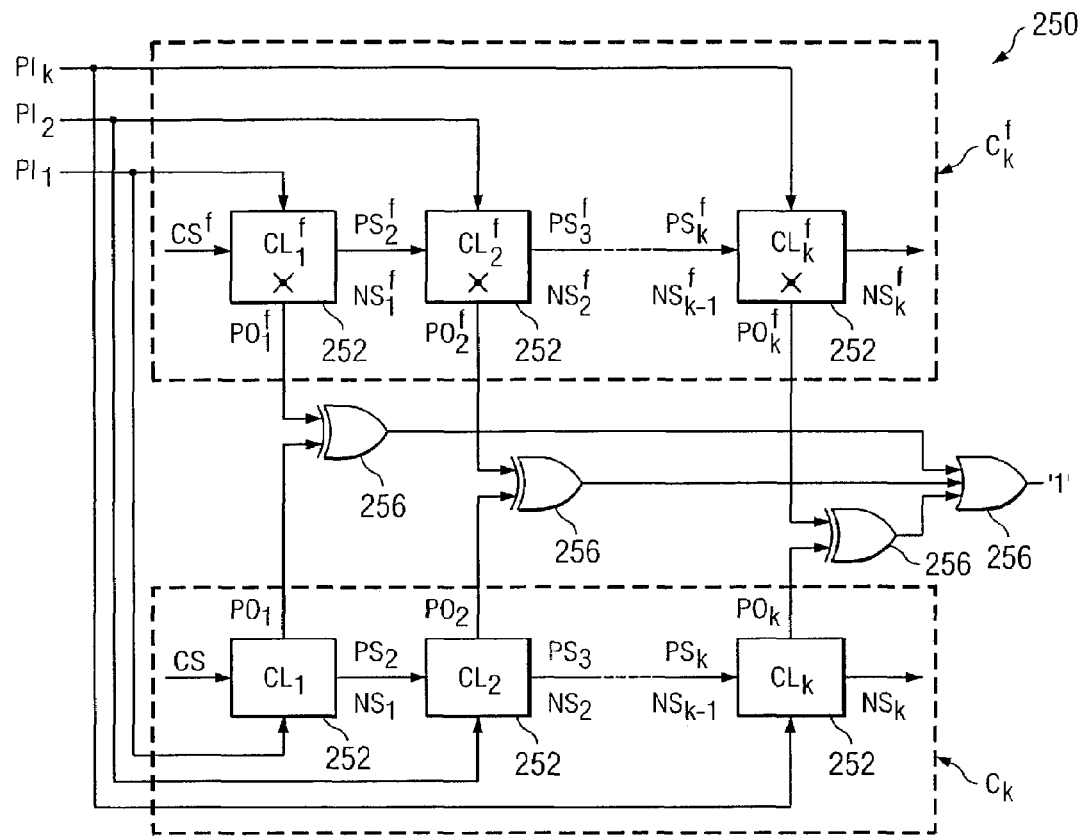
FIG. 7 is a diagram illustrating an example miter circuit model.

FIG. 7 is a diagram illustrating an example miter circuit model 250. Miter circuit model 250 includes good circuit model $C_k$ and faulty circuit model $C_k^f$ that comprise combinational logic $CL_i$ and $CL_i^f$ 252, respectively, coupled to OR gates 256 as illustrated in FIG. 7. Each combinational logic $CL_i$ and $CL_i^f$ 252 may receive common primary input $PI_i$. The corresponding primary outputs of combinational logic $CL_i$ and $CL_i^f$ 252 may be pairwise mitered together and the miter output asserted to have a logic value of one. Next state $NS_i$ output from combinational logic $CL_i$ 252 becomes present state $PS_{i+1}$ input for combinational logic $CL_{i+1}$ 252, and next state $NS_i^f$ output from combinational logic $CL_i^f$ 252 becomes present state $PS_{i+1}^f$ input for combinational logic $CL_{i+1}^f$ 252.

Referring back to FIG. 6, current states CS and $CS^f$ are impressed on model $C_k$ and model $C_k^f$, respectively, at step 218. According to one embodiment, present state $PS_1$ of model $C_k$ is replaced by current state CS, and present state $PS_1^f$ of model $C_k^f$ is initialized to current state $CS^f$. Satisfiability is performed at step 222 to determine if there is a test sequence for fault f of length≦k. If current states CS and $CS_f$ are fully specified, that is, comprise only ones and zeros and no Xs, then a solution to model $C_k^{ATPG}(f)$ exists if and only if there exists a test sequence for f of length≦k, which may be described by the following Proposition:

Proposition. If current states CS and $CS^f$ are fully specified, miter circuit model $C_k^{ATPG}(f)$ is satisfiable if and only if there exists a test sequence of length≦k for fault f in circuit S, with circuits S and $S^f$ initialized with current states CS and $CS^f$, respectively, where circuit $S^f$ denotes the faulty circuit.

According to one embodiment, miter circuit model $C_k^{ATPG}(f)$ may be translated to a satisfiability formula according to any suitable technique for translating a combinational automatic test pattern generation problem to a satisfiability problem. The technique may be modified to represent that fault f is instantiated at each time frame of $C_k^f$ in order to yield a multi-fault automatic test pattern generation problem rather than a single fault combinational automatic test pattern generation problem.

If model $c_k^{ATPG}(f)$ is not satisfiable at step 226, the method proceeds to step 228 to report that there is no test sequence of length≦k for fault f of circuit S. If model $C_k^{ATPG}(f)$ is satisfiable at step 226, the method proceeds to step 232 to report the test sequence of length≦k for fault f of circuit S. As an example, satisfiability solver 34 may report a test vector if the circuit model is testable. The test vector may be converted into a test sequence. After reporting the sequence, the method terminates.

In summary, the method takes a pair of starting states, one for a good circuit and one for a faulty circuit, and uses the current states of a satisfiability solver as the starting point for finding a test sequence for a given fault. According to one embodiment, this may give the satisfiability-based formulation an improved starting point for finding the test sequence, which may provide for more efficient generation of shorter test sequences.

Modifications, additions, or omissions may be made to the method without departing from the scope of the invention. Additionally, steps may be performed in any suitable order without departing from the scope of the invention.

Figure 8:
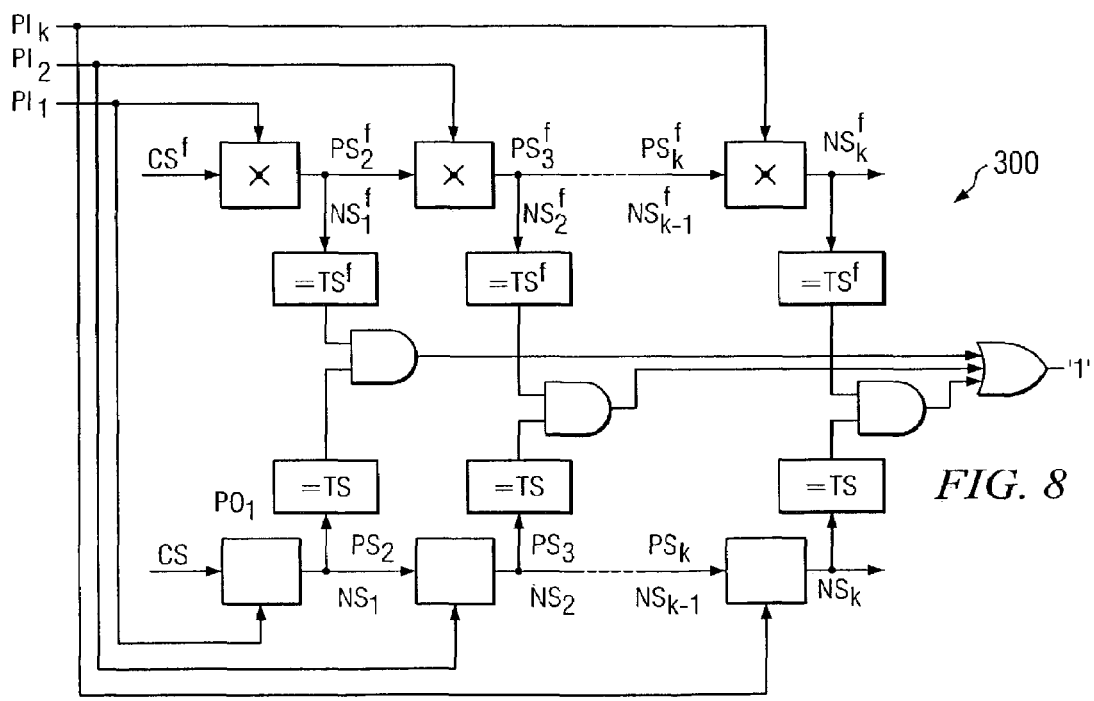
FIG. 8 is a diagram illustrating another example miter circuit model.

FIG. 8 is a diagram illustrating another example miter circuit model 300. For hard-to-test faults, target states TS and $TS^f$ from which a fault is testable may be found, but a bridge between the current states and target states might not be found. Satisfiability solver 34 may be used to find a bridging sequence between the current states and target states by generating miter circuit model 300, converting miter circuit model 300 to a satisfiability formula, and solving the satisfiability problem.

4. Reducing A Test Sequence Using A Satisfiability Solver

Figure 9:
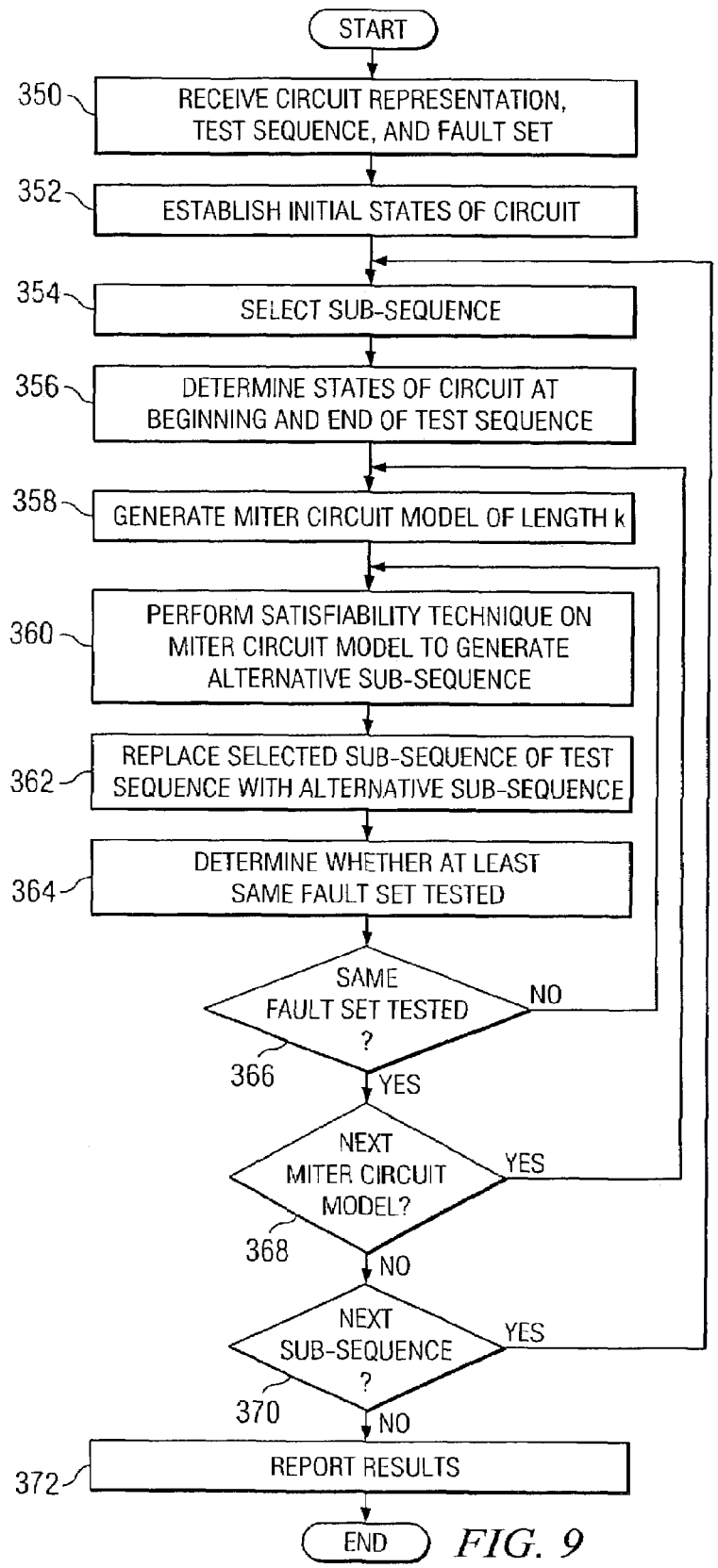
FIG. 9 is a flowchart illustrating one embodiment of a method for reducing a test sequence.

FIG. 9 is a flowchart illustrating one embodiment of a method for reducing a test sequence. According to one embodiment, the method reduces the size of a test sequence, measured as the number of vectors of the test sequence, such that the reduced sequence is capable of testing at least the same number of faults as the original sequence. The method reduces the size by determining suitable replacements for portions of the test sequence.

According to one embodiment, the method begins at step 350, where a circuit representation, a test sequence, and a fault set tested by the sequence on the circuit representation are received. The initial states of the circuit before the application of each vector of the test sequence is established at step 352 by simulating the test sequence on the circuit.

A sub-sequence of length L of the test sequence is selected at step 354. The states S1 and S2 of the circuit at the beginning and end of the selected sub-sequence are determined at step 356. A circuit miter model of length k time frames is generated at step 358. The initial length may be k=1 time frame. An example circuit miter model is described in more detail with reference to FIG. 10. A satisfiability technique is performed at step 360 to generate an alternative sub-sequence. The circuit miter model may be translated to a conjunctive normal form (CNF) formula, which is solved by a satisfiability solver to obtain the alternative sub-sequence.

The selected sub-sequence of the test sequence is replaced with the alternative sub-sequence at step 362 to yield a next test sequence. The next test sequence is simulated at step 364 to see if the next test sequence tests at least the same fault set as the selected test sequence can test. If the next test sequence cannot test at least the same fault set at step 366, the method returns to step 360 to generate a next alternative sub-sequence.

If the next test sequence tests at least the same fault set at step 366, the method proceeds to step 368 to determine if there is a next miter circuit model. There may be a next miter circuit model if the solutions using the current miter circuit model have been exhausted or some resource limit such as a number of solutions examined, runtime, or memory, has been exceeded. If there is a next miter circuit model, the method returns to step 358 to generate the next miter circuit model with a larger value k<L.

If there is no next miter circuit model, the method proceeds to step 370 to determine if there is a next sub-sequence. There may be a next sub-sequence if the original test sequence has not been compressed by a required amount and no resource constraint has been exceeded. If there is a next sub-sequence, the method returns to step 354 to select the next sub-sequence. If there is no next sub-sequence, the method proceeds to step 372 to report the results. After reporting the results, the method terminates.

Modifications, additions, or omissions may be made to the method without departing from the scope of the invention. Additionally, steps may be performed in any suitable order without departing from the scope of the invention.

Figure 10:
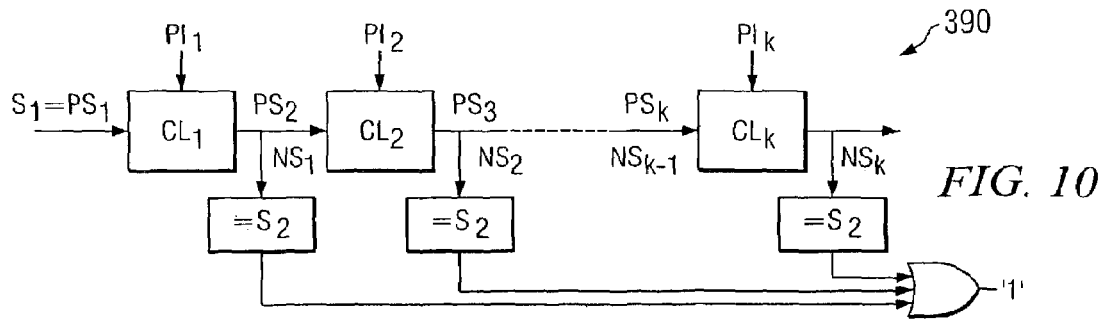
FIG. 10 is a diagram illustrating yet another example miter circuit model.

FIG. 10 is a diagram illustrating an example miter circuit model 390 that may be used with the method of FIG. 9.

Certain embodiments of the invention may provide one or more technical advantages. A technical advantage of one embodiment may be that a satisfiability solver may be used to classify a fault as testable or untestable, which may provide for more efficient test sequence generation. Another technical advantage of one embodiment may be that a satisfiability solver may be used to generate shorter test sequences, which may provide for more efficient testing of circuits.

Although an embodiment of the invention and its advantages are described in detail, a person skilled in the art could make various alterations, additions, and omissions without departing from the spirit and scope of the present invention as defined by the appended claims.

What is claimed is:

1. A method for classifying a fault, comprising:
   receiving a circuit representation describing a circuit;
   receiving a fault set comprising one or more faults;
   establishing a circuit model corresponding to the circuit representation, the circuit model associated with a number of time frames; and
   repeating the following for each fault of the fault set:
      selecting a fault from the fault set;
      generating a satisfiability problem corresponding to the selected fault as associated with the circuit model;
      determining whether the satisfiability problem is unsatisfiable; and
      classifying the selected fault as untestable if the satisfiability problem is unsatisfiable.

2. The method of claim 1, wherein establishing the circuit model corresponding to the circuit representation comprises:
   unrolling the circuit representation for the number of time frames to generate the circuit model having the number of time frames; and
   instantiating the selected fault at a last time frame of the number time frames.

3. The method of claim 1, wherein:
   generating the satisfiability problem corresponding to the selected fault as associated with the circuit model comprises generating a conjunctive normal form formula corresponding to the selected fault as associated with the circuit model; and
   determining whether the satisfiability problem is unsatisfiable comprises determining whether the conjunctive normal form formula is unsatisfiable.

4. The method of claim 1, further comprising repeating the following for a next number of time frames:
   establishing a next circuit model corresponding to the circuit representation, the next circuit model associated with the next number of time frames; and
   repeating the following for each fault of the fault set:
      selecting a fault of the fault set;
      generating a next satisfiability problem corresponding to the selected fault as associated with the next circuit model;
      determining whether the next satisfiability problem is unsatisfiable; and
      classifying the selected fault as untestable if the next satisfiability problem is unsatisfiable.

5. A system for classifying a fault, comprising:
   an input operable to:
      receive a circuit representation describing a circuit; and
      receive a fault set comprising one or more faults; and
   a processor coupled to the input and operable to:
      establish a circuit model corresponding to the circuit representation, the circuit model associated with a number of time frames; and
      repeat the following for each fault of the fault set:
         select a fault from the fault set;
         generate a satisfiability problem corresponding to the selected fault as associated with the circuit model;
         determine whether the satisfiability problem is unsatisfiable; and
         classify the selected fault as untestable if the satisfiability problem is unsatisfiable.

6. The system of claim 5, wherein the processor is operable to establish the circuit model corresponding to the circuit representation by:
   unrolling the circuit representation for the number of time frames to generate the circuit model having the number of time frames; and
   instantiating the selected fault at a last time frame of the number time frames.

7. The system of claim 5, wherein the processor is operable to:
   generate the satisfiability problem corresponding to the selected fault as associated with the circuit model by generating a conjunctive normal form formula corresponding to the selected fault as associated with the circuit model; and
   determine whether the satisfiability problem is unsatisfiable by determining whether the conjunctive normal form formula is unsatisfiable.

8. The system of claim 5, wherein the processor is further operable to repeat the following for a next number of time frames:
   establish a next circuit model corresponding to the circuit representation, the next circuit model associated with the next number of time frames; and
   repeat the following for each fault of the fault set:
      select a fault of the fault set;
      generate a next satisfiability problem corresponding to the selected fault as associated with the next circuit model;
      determine whether the next satisfiability problem is unsatisfiable; and
      classify the selected fault as untestable if the next satisfiability problem is unsatisfiable.

9. Logic for classifying a fault, the logic comprising executable instructions embodied in a computer-readable medium and when executed by a computer system operable to:
   receive a circuit representation describing a circuit;
   receive a fault set comprising one or more faults;
   establish a circuit model corresponding to the circuit representation, the circuit model associated with a number of time frames; and
   repeat the following for each fault of the fault set:
      select a fault from the fault set;
      generate a satisfiability problem corresponding to the selected fault as associated with the circuit model;
      determine whether the satisfiability problem is unsatisfiable; and
      classify the selected fault as untestable if the satisfiability problem is unsatisfiable.

10. The logic of claim 9, operable to establish the circuit model corresponding to the circuit representation by:
    unrolling the circuit representation for the number of time frames to generate the circuit model having the number of time frames; and
    instantiating the selected fault at a last time frame of the number time frames.

11. The logic of claim 9, operable to:
    generate the satisfiability problem corresponding to the selected fault as associated with the circuit model by generating a conjunctive normal form formula corresponding to the selected fault as associated with the circuit model; and
determine whether the satisfiability problem is unsatisfiable by determining whether the conjunctive normal form formula is unsatisfiable.

12. The logic of claim 9, further operable to repeat the following for a next number of time frames:
establish a next circuit model corresponding to the circuit representation, the next circuit model associated with the next number of time frames; and
repeat the following for each fault of the fault set:
select a fault of the fault set;
generate a next satisfiability problem corresponding to the selected fault as associated with the next circuit model;
determine whether the next satisfiability problem is unsatisfiable; and
classify the selected fault as untestable if the next satisfiability problem is unsatisfiable.

13. A system for classifying a fault, comprising:
means for receiving a circuit representation describing a circuit;
means for receiving a fault set comprising one or more faults;
means for establishing a circuit model corresponding to the circuit representation, the circuit model associated with a number of time frames; and
means for repeating the following for each fault of the fault set:
selecting a fault from the fault set;
generating a satisfiability problem corresponding to the selected fault as associated with the circuit model;
determining whether the satisfiability problem is unsatisfiable; and
classifying the selected fault as untestable if the satisfiability problem is unsatisfiable.

14. A method for classifying a fault, comprising:
receiving a circuit representation describing a circuit;
receiving a fault set comprising one or more faults;
establishing a circuit model corresponding to the circuit representation, the circuit model associated with a number of time frames, the circuit model established by unrolling the circuit representation for the number of time frames to generate the circuit model having the number of time frames;
repeating the following for each fault of the fault set:
selecting a fault from the fault set;
instantiating the selected fault at a last time frame of the number time frames;
generating a satisfiability problem corresponding to the selected fault as associated with the circuit model by generating a conjunctive normal form formula corresponding to the selected fault as associated with the circuit model;
determining whether the satisfiability problem is unsatisfiable by determining whether the conjunctive normal form formula is unsatisfiable; and
classifying the selected fault as untestable if the satisfiability problem is unsatisfiable; and
repeating the following for a next number of time frames:
establishing a next circuit model corresponding to the circuit representation, the next circuit model associated with the next number of time frames; and
repeating the following for each fault of the fault set:
selecting a fault of the fault set;
generating a next satisfiability problem corresponding to the selected fault as associated with the next circuit model;
determining whether the next satisfiability problem is unsatisfiable; and
classifying the selected fault as untestable if the next satisfiability problem is unsatisfiable.

15. A method for generating a test sequence, comprising:
receiving a circuit representation describing a circuit;
receiving a fault associated with the circuit representation;
establishing a miter circuit model according to the circuit representation, the miter circuit model associated with a good circuit model and a faulty circuit model;
establishing a satisfiability problem corresponding to the fault as associated with the miter circuit model;
determining whether the satisfiability problem is satisfiable; and
generating a test sequence for the fault as associated with the miter circuit model if the satisfiability problem is satisfiable.

16. The method of claim 15, wherein establishing the miter circuit model according to the circuit representation comprises:
unrolling the circuit representation to yield a circuit model having one or more time frames;
generating the good circuit model from the circuit model; and
generating the faulty circuit model from the circuit model having the fault instantiated at each time frame of the one or more time frames.

17. The method of claim 15, wherein establishing the satisfiability problem corresponding to the fault as associated with the miter circuit model comprises:
impressing a first current state on the good circuit model; and
impressing a second current state on the faulty circuit model.

18. The method of claim 15, wherein generating the test sequence for the fault as associated with the miter circuit model comprises:
obtaining a test vector corresponding to a solution of the satisfiability problem; and
transforming the test vector to the test sequence for the fault as associated with the miter circuit model.

19. The method of claim 15, wherein:
establishing the satisfiability problem corresponding to the fault as associated with the miter circuit model comprises:
establishing a first current state and a first target state; and
establishing a second current state and a second target state; and
generating the test sequence for the fault as associated with the miter circuit model comprises generating a bridging sequence between the first current state and the first target state and between the second current state and the second target state.

20. A system for generating a test sequence, comprising:
an input operable to:
receive a circuit representation describing a circuit; and
receive a fault associated with the circuit representation; and
a processor coupled to the input and operable to:
establish a miter circuit model according to the circuit representation, the miter circuit model associated with a good circuit model and a faulty circuit model;

establish a satisfiability problem corresponding to the fault as associated with the miter circuit model;

determine whether the satisfiability problem is satisfiable; and generate a test sequence for the fault as associated with the miter circuit model if the satisfiability problem is satisfiable.

21. The system of claim 20, wherein the processor is operable to establish the miter circuit model according to the circuit representation by:

unrolling the circuit representation to yield a circuit model having one or more time frames;

generating the good circuit model from the circuit model; and generating the faulty circuit model from the circuit model having the fault instantiated at each time frame of the one or more time frames.

22. The system of claim 20, wherein the processor is operable to establish the satisfiability problem corresponding to the fault as associated with the miter circuit model by:

impressing a first current state on the good circuit model; and impressing a second current state on the faulty circuit model.

23. The system of claim 20, wherein the processor is operable to generate the test sequence for the fault as associated with the miter circuit model by:

obtaining a test vector corresponding to a solution of the satisfiability problem; and transforming the test vector to the test sequence for the fault as associated with the miter circuit model.

24. The system of claim 20, wherein the processor is operable to:

establish the satisfiability problem corresponding to the fault as associated with the miter circuit model by:

establishing a first current state and a first target state; and establishing a second current state and a second target state; and generate the test sequence for the fault as associated with the miter circuit model by generating a bridging sequence between the first current state and the first target state and between the second current state and the second target state.

25. Logic for generating a test sequence, the logic comprising executable instructions embodied in a computer-readable medium and when executed by a computer system operable to:

receive a circuit representation describing a circuit;

receive a fault associated with the circuit representation;

establish a miter circuit model according to the circuit representation, the miter circuit model associated with a good circuit model and a faulty circuit model;

establish a satisfiability problem corresponding to the fault as associated with the miter circuit model;

determine whether the satisfiability problem is satisfiable; and generate a test sequence for the fault as associated with the miter circuit model if the satisfiability problem is satisfiable.

26. The logic of claim 25, operable to establish the miter circuit model according to the circuit representation by:

unrolling the circuit representation to yield a circuit model having one or more time frames;

generating the good circuit model from the circuit model; and generating the faulty circuit model from the circuit model having the fault instantiated at each time frame of the one or more time frames.

27. The logic of claim 25, operable to establish the satisfiability problem corresponding to the fault as associated with the miter circuit model by:

impressing a first current state on the good circuit model; and impressing a second current state on the faulty circuit model.

28. The logic of claim 25, operable to generate the test sequence for the fault as associated with the miter circuit model by:

obtaining a test vector corresponding to a solution of the satisfiability problem; and transforming the test vector to the test sequence for the fault as associated with the miter circuit model.

29. The logic of claim 25, operable to:

establish the satisfiability problem corresponding to the fault as associated with the miter circuit model by:

establishing a first current state and a first target state; and establishing a second current state and a second target state; and generate the test sequence for the fault as associated with the miter circuit model by generating a bridging sequence between the first current state and the first target state and between the second current state and the second target state.

30. A system for generating a test sequence, comprising:

means for receiving a circuit representation describing a circuit;

means for receiving a fault associated with the circuit representation;

means for establishing a miter circuit model according to the circuit representation, the miter circuit model associated with a good circuit model and a faulty circuit model;

means for establishing a satisfiability problem corresponding to the fault as associated with the miter circuit model;

means for determining whether the satisfiability problem is satisfiable; and means for generating a test sequence for the fault as associated with the miter circuit model if the satisfiability problem is satisfiable.

31. A method for generating a test sequence, comprising:

receiving a circuit representation describing a circuit;

receiving a fault associated with the circuit representation;

establishing a miter circuit model according to the circuit representation, the miter circuit model associated with a good circuit model and a faulty circuit model, wherein establishing the miter circuit model according to the circuit representation comprises:

unrolling the circuit representation to yield a circuit model having one or more time frames;

generating the good circuit model from the circuit model; and generating the faulty circuit model from the circuit model having the fault instantiated at each time frame of the one or more time frames;

establishing a satisfiability problem corresponding to the fault as associated with the miter circuit model, wherein establishing the satisfiability problem corresponding to the fault as associated with the miter circuit model comprises:
impressing a first current state on the good circuit model; and
impressing a second current state on the faulty circuit model, wherein establishing the satisfiability problem corresponding to the fault as associated with the miter circuit model further comprises:
establishing a third current state and a third target state; and
establishing a fourth current state and a fourth target state; and
determining whether the satisfiability problem is satisfiable; and
generating a test sequence for the fault as associated with the miter circuit model if the satisfiability problem is satisfiable, wherein generating the test sequence for the fault as associated with the miter circuit model comprises:
obtaining a test vector corresponding to a solution of the satisfiability problem; and
transforming the test vector to the test sequence for the fault as associated with the miter circuit model, wherein generating the test sequence for the fault as associated with the miter circuit model further comprises generating a bridging sequence between the third current state and the third target state and between the fourth current state and the fourth target state.

32. A method for reducing a test sequence, comprising:
receiving a circuit representation describing a circuit;
receiving a test sequence and a fault set comprising one or more faults, the test sequence operable to test the one or more faults of the fault set as applied to the circuit representation, the test sequence comprising a plurality of sub-sequences;
repeating the following for one or more sub-sequences of the plurality of sub-sequences:
selecting a sub-sequence of the test sequence;
establishing a satisfiability problem corresponding to the sub-sequence as associated with the circuit representation;
solving the satisfiability problem to generate an alternative sub-sequence; and
replacing the selected sub-sequence with the alternative sub-sequence to generate a next test sequence;
determining whether the next test sequence is operable to test at least the one or more faults of the fault set; and
reducing the test sequence in accordance with the determination.

33. The method of claim 32, wherein establishing the satisfiability problem corresponding to the sub-sequence as associated with the circuit representation comprises:
determining a miter circuit model corresponding to the circuit representation; and
generating the satisfiability problem in accordance with the miter circuit model.

34. A system for reducing a test sequence, comprising:
an input operable to:
receive a circuit representation describing a circuit; and
receive a test sequence and a fault set comprising one or more faults, the test sequence operable to test the one or more faults of the fault set as applied to the circuit representation, the test sequence comprising a plurality of sub-sequences; and a processor coupled to the input and operable to:
repeat the following for one or more sub-sequences of the plurality of sub-sequences:
select a sub-sequence of the test sequence;
establish a satisfiability problem corresponding to the sub-sequence as associated with the circuit representation;
solve the satisfiability problem to generate an alternative sub-sequence; and
replace the selected sub-sequence with the alternative sub-sequence to generate a next test sequence;
determine whether the next test sequence is operable to test at least the one or more faults of the fault set; and
reduce the test sequence in accordance with the determination.

35. The system of claim 34, the processor operable to establish the satisfiability problem corresponding to the sub-sequence as associated with the circuit representation by:
determining a miter circuit model corresponding to the circuit representation; and
generating the satisfiability problem in accordance with the miter circuit model.

36. Logic for reducing a test sequence, the logic comprising executable instructions embodied in a computer-readable medium and when executed by a computer system operable to:
receive a circuit representation describing a circuit;
receive a test sequence and a fault set comprising one or more faults, the test sequence operable to test the one or more faults of the fault set as applied to the circuit representation, the test sequence comprising a plurality of sub-sequences;
repeat the following for one or more sub-sequences of the plurality of sub-sequences:
select a sub-sequence of the test sequence;
establish a satisfiability problem corresponding to the sub-sequence as associated with the circuit representation;
solve the satisfiability problem to generate an alternative sub-sequence; and
replace the selected sub-sequence with the alternative sub-sequence to generate a next test sequence;
determine whether the next test sequence is operable to test at least the one or more faults of the fault set; and
reduce the test sequence in accordance with the determination.

37. The logic of claim 36, operable to establish the satisfiability problem corresponding to the sub-sequence as associated with the circuit representation by:
determining a miter circuit model corresponding to the circuit representation; and
generating the satisfiability problem in accordance with the miter circuit model.

38. A method for generating a test sequence, comprising:
receiving a circuit representation representing a circuit;
receiving a fault list listing a plurality of faults;
performing an incomplete technique to generate a first test sequence for a first portion of the plurality of faults or to classify the first portion of the plurality of faults as untestable, the first test sequence operable to test the first portion of the plurality of faults;
performing a satisfiability-based technique to generate a second test sequence for a second portion of the plurality of faults or to classify the second portion of the plurality of faults as untestable, the second test sequence operable to test the second portion of the plurality of faults; and performing a complete technique to generate a third test sequence for a third portion of the plurality of faults or to classify the third portion of the plurality of faults as untestable, the third test sequence operable to test the third portion of the plurality of faults.

39. The method of claim 38, wherein performing the satisfiability-based technique to generate the second test sequence operable to test the second portion of the plurality of faults comprises:

establishing a satisfiability problem corresponding to the second portion of the plurality of faults as associated with the circuit representation;

determining whether the satisfiability problem is satisfiable; and generating a test sequence for the second portion of the plurality of faults if the satisfiability problem is satisfiable.

40. A system for generating a test sequence, comprising:

an input operable to:

receive a circuit representation representing a circuit; and receive a fault list listing a plurality of faults; and a processor coupled to the input and operable to:

perform an incomplete technique to generate a first test sequence for a first portion of the plurality of faults or to classify the first portion of the plurality of faults as untestable, the first test sequence operable to test the first portion of the plurality of faults;

perform a satisfiability-based technique to generate a second test sequence for a second portion of the plurality of faults or to classify the second portion of the plurality of faults as untestable, the second test sequence operable to test the second portion of the plurality of faults; and perform a complete technique to generate a third test sequence for a third portion of the plurality of faults or to classify the third portion of the plurality of faults as untestable, the third test sequence operable to test the third portion of the plurality of faults.

41. The system of claim 40, the processor operable to perform the satisfiability-based technique to generate the second test sequence operable to test the second portion of the plurality of faults by:

establishing a satisfiability problem corresponding to the second portion of the plurality of faults as associated with the circuit representation;

determining whether the satisfiability problem is satisfiable; and generating a test sequence for the second portion of the plurality of faults if the satisfiability problem is satisfiable.

42. Logic for generating a test sequence, the logic comprising executable instructions embodied in a computer-readable medium and when executed by a computer system operable to:

receive a circuit representation representing a circuit;

receive a fault list listing a plurality of faults;

perform an incomplete technique to generate a first test sequence for a first portion of the plurality of faults or to classify the first portion of the plurality of faults as untestable, the first test sequence operable to test the first portion of the plurality of faults;

perform a satisfiability-based technique to generate a second test sequence for a second portion of the plurality of faults or to classify the second portion of the plurality of faults as untestable, the second test sequence operable to test the second portion of the plurality of faults; and perform a complete technique to generate a third test sequence for a third portion of the plurality of faults or to classify the third portion of the plurality of faults as untestable, the third test sequence operable to test the third portion of the plurality of faults.

43. The logic of claim 42, operable to perform the satisfiability-based technique to generate the second test sequence operable to test the second portion of the plurality of faults by:

establishing a satisfiability problem corresponding to the second portion of the plurality of faults as associated with the circuit representation;

determining whether the satisfiability problem is satisfiable; and generating a test sequence for the second portion of the plurality of faults if the satisfiability problem is satisfiable.

* * * * *

UNITED STATES PATENT AND TRADEMARK OFFICE
CERTIFICATE OF CORRECTION

PATENT NO. : 7,076,712 B2
APPLICATION NO. : 10/444483
DATED : July 11, 2006
INVENTOR(S) : Mukul R. Prasad et al.

It is certified that error appears in the above-identified patent and that said Letters Patent is hereby corrected as shown below:

Title Page 1, References Cited (56), Other Publications, Right Column, Line 13, after "Computer Science Dept., CMU, PA" delete ":" and insert -- ; --.
Title Page 2, References Cited (56), Other Publications, Left Column, Line 38, after "(NSF Grant No. MIP-" delete "9387581" and insert -- 9357581 --.

Signed and Sealed this

Second Day of February, 2010

David J. Kappos
*Director of the United States Patent and Trademark Office*